United States Patent [19]
Hibino et al.

[11] Patent Number: 5,716,869
[45] Date of Patent: Feb. 10, 1998

[54] METHOD OF FORMING A WIRING LAYER OF A SEMICONDUCTOR DEVICE USING REFLOW PROCESS

[75] Inventors: Satoshi Hibino; Takahisa Yamaha, both of Hamamatsu, Japan

[73] Assignee: Yamaha Corporation, Japan

[21] Appl. No.: 711,986

[22] Filed: Sep. 10, 1996

[30] Foreign Application Priority Data

Sep. 18, 1995 [JP] Japan ................. 7-238776

[51] Int. Cl.⁶ .................................. H01L 21/283
[52] U.S. Cl. ............... 437/188; 437/192; 437/194; 437/195
[58] Field of Search .................... 437/187, 188, 437/189, 190, 192, 194, 197; 29/25.01; 204/192.15, 192.17, 298.25

[56] References Cited

U.S. PATENT DOCUMENTS

| | | | |
|---|---|---|---|
| 4,898,623 | 2/1990 | Pinkhasov | 148/3 |
| 4,970,176 | 11/1990 | Tracy et al. | 437/187 |
| 5,266,521 | 11/1993 | Lee et al. | 437/188 |
| 5,282,944 | 2/1994 | Sanders et al. | 204/192.38 |
| 5,290,731 | 3/1994 | Sugano et al. | 437/174 |
| 5,318,923 | 6/1994 | Park | 437/188 |
| 5,371,042 | 12/1994 | Ong | 437/194 |
| 5,512,512 | 4/1996 | Isobe | 437/187 |
| 5,514,257 | 5/1996 | Kobayashi et al. | 204/192.17 |

FOREIGN PATENT DOCUMENTS

| | | |
|---|---|---|
| 6-169018 | 6/1994 | Japan . |
| 6-244138 | 9/1994 | Japan . |

Primary Examiner—T. N. Quach

[57] ABSTRACT

A method of manufacturing a semiconductor device having the steps of: forming an insulating layer on a substrate having a semiconductor surface; forming a contact hole in and through the insulating layer; forming a conductive film on the inner surface of the contact hole and on the surface of the insulating film; forming a vapor deposited titanium film on the inner wall of a vacuum chamber; placing the substrate formed with the conductive film in the vacuum chamber; and heating the substrate and reflowing the conductive film. A good wiring layer can be formed by suppressing generation of a void during a reflow process.

8 Claims, 6 Drawing Sheets

METHOD OF FORMING A WIRING LAYER OF A SEMICONDUCTOR DEVICE USING REFLOW PROCESS

BACKGROUND OF THE INVENTION a) Field of the Invention

The present invention relates to a method of manufacturing a semiconductor device, and more particularly to a method of manufacturing a semiconductor device suitable for forming a wiring layer having good step coverage.

b) Description of the Related Art

An aluminum alloy wiring layer is formed through sputtering or the like on an interlevel insulating film formed with a contact hole. Since it is difficult to deposit the wiring layer on the side wall of the contact hole, step coverage is degraded and good electrical contact is difficult between the conductive surface exposing at the bottom of the contact hole and the wiring layer deposited on the upper surface of the interlevel insulating film.

In order to ensure good electrical contact, heat treatment is executed in a vacuum atmosphere after the deposition of the wiring layer. The heat treatment reflows the aluminum alloy wiring layer and the contact hole is filled with the wiring layer to thus obtain good electrical contact.

During the whole period of the reflow process, the atmosphere is preferably maintained high vacuum. If the degree of vacuum lowers, a void is likely to be formed in the contact hole, making it difficult to obtain good electrical contact. Since the substrate is heated during the reflow process, gas such as water vapor is generated in the interlevel insulating film and tends to lower the degree of vacuum. Therefore, it is difficult to prevent generation of void in the contact hole during the reflow process.

SUMMARY OF THE INVENTION

It is an object of the present invent/on to provide a method of manufacturing a semiconductor device capable of forming a good wiring layer by suppressing generation of a void during a reflow process.

According to one aspect of the present invention, there is provided a method of manufacturing a semiconductor device comprising the steps of: forming an insulating layer on a substrate having a semiconductor surface; forming a contact hole in and through the insulating layer; forming a conductive film on the inner surface of the contact hole and on the surface of the insulating film; forming a vapor deposited titanium film on the inner wall of a vacuum chamber; placing the substrate formed with the conductive film in the vacuum chamber; and heating the substrate and reflowing the conductive film.

The vapor deposited titanium film formed on the inner wall of the vacuum chamber has the gettering function. Therefore, by forming the vapor deposited titanium film on the inner wall of the vacuum chamber, it becomes possible to raise the vacuum degree in the vacuum chamber and to suppress the vacuum degree from being lowered during the reflow process. Since the vacuum degree can be maintained high during the reflow process, it is possible to suppress generation of a void in a reflowed wiring layer.

In another aspect of the present invention, the conductive film forming step may place the substrate in another vacuum chamber connected to the vacuum chamber via a transport vacuum chamber and form the conductive film, and the step of placing the substrate in the vacuum chamber may include the steps of transporting the substrate from the other vacuum chamber to the transport vacuum chamber and transporting the substrate from the transport vacuum chamber to the vacuum chamber.

The substrate is transported from the vacuum chamber for forming the conductive layer to the vacuum chamber for the reflow process via the transport vacuum chamber. Therefore, the substrate can be successively subjected to the film forming process and the reflow process without being exposed in ambient atmosphere.

In another aspect of the invention, the conductive film forming step may form the conductive film by sputtering, and the vapor deposited titanium film forming step may form the vapor deposited titanium film by sputtering.

Both the conductive film and the vapor deposited titanium film on the inner wall of the reflow chamber are formed by sputtering. Therefore, forming the conductive film and the reflow process can be successively performed by using a multi-chamber sputtering system.

In another aspect of the invention, the method may further comprise the step of processing a plurality of substrates by repeating a plurality of times the insulating film forming step, the contact hole forming step, the conductive film forming step, the step of placing the substrate in the vacuum chamber, and the heating and reflowing step, sequentially in this order.

The vapor deposited titanium film formed once on the inner wall of the reflow chamber maintains the gettering effects for a plurality of reflow processes. Therefore, a plurality of reflow processes can be performed if the vapor deposited titanium film is formed once.

As above, it is possible to suppress the vacuum degree from being lowered during the reflow process and to prevent a void from being formed in a contact hole. Since formation of a void is prevented, good electrical contact can be obtained between the surface of a conductive layer underlying the interlevel insulating film and the upper level wiring layer.

DETAILED DESCRIPTION OF THE PREFERRED EMBODIMENTS

An embodiment of the invention will be described taking as an illustrative case a process of laminating an interlevel insulating film and a wiring layer on the surface of a silicon substrate. In the following description, although an electronic element formed on the surface of the silicon substrate is omitted, electronic elements such as a source/drain region of MOSFET and a diffusion resistor region are actually formed in the connection region to the wiring layer.

Figure 1A:
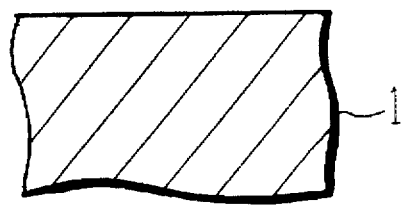
FIGS. 1A to 1D are cross sectional views of a substrate and an interlevel insulating film illustrating a method of forming a wiring layer according to an embodiment of the invention.
Figure 1B:
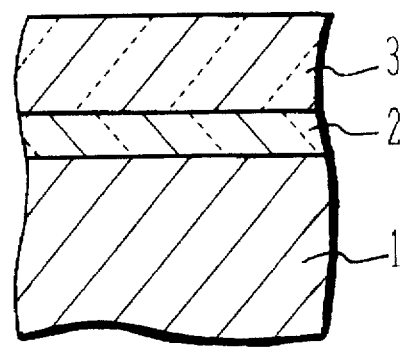

As shown in FIG. 1A, a silicon substrate 1 with an exposed silicon surface is prepared. As shown in FIG. 1B, on the surface of the silicon substrate 1, a phosphosilicate glass (PSG) film 2 of 100 nm thick and a borophosphosilicate glass (BPSG) film 3 of 800 nm thick are stacked in this order.

Figure 1C:
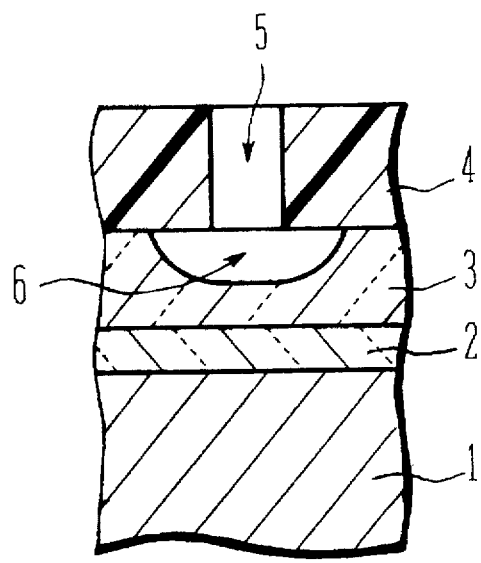

As shown in FIG. 1C, a resist film 4 is coated on the surface of the BPSG film 3, and an opening 5 of 0.5 to 1.0 μm in diameter Is formed in the resist film 4. The upper surface area of the BPSG film 3 is partially etched through the opening 5. This etching is isotropic etching using, for example, $CF_4+O_2$ as etching gas. Since the BPSG film 3 is etched also in the lateral direction, a recess 6 is formed having an opening surface with a diameter larger than that of the opening 5 and a sloped side wall.

Figure 1D:
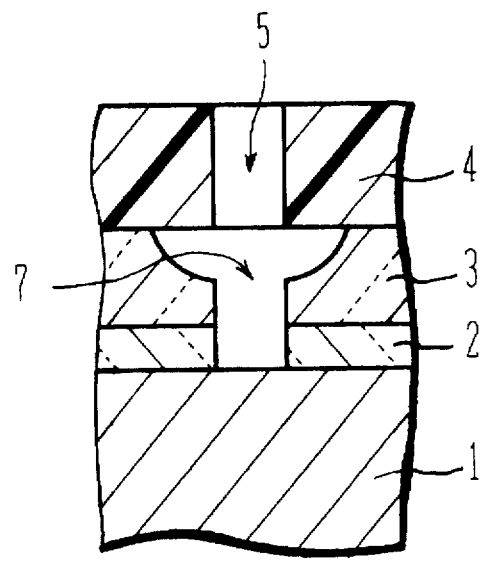

As shown in FIG. 1D, the BPSG film 3 and PSG film 2 are etched successively via the opening 5. This etching is anisotropic etching using, for example, $CF_4+CHF_3$ as etching gas. Since the films are etched mostly in the downward direction, a recess is formed having generally the same diameter as the opening 5. Therefore, a contact hole 7 is formed in the BPSG film 3 and PSG film 2, having a tapered inner circumference at the upper portion thereof.

After the contact hole 7 is formed, the resist film 4 is removed.

Figure 2A:
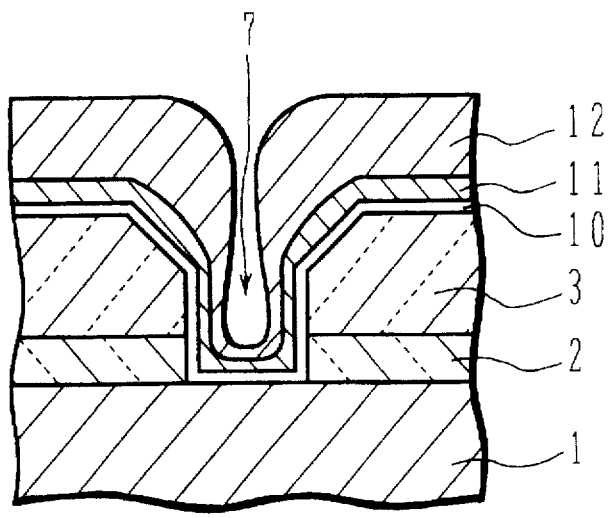
FIGS. 2A and 2B are cross sectional views of a substrate, an interlevel insulating film, and a wiring layer illustrating the method of forming a wiring layer according to the embodiment.

As shown In FIG. 2A, a titanium (Ti) film 10 of 20 nm thick is formed covering the inner surface of the contact hole 7 and the upper surface of the BPSG film 3. The Ti film 10 is formed, for example, by DC sputtering with a DC input power of 3 kW and a substrate temperature of 200° C. by using Ti as a target and argon gas (Ar) at a pressure of 5 Torr as sputtering gas.

Next, a titanium nitride (TIN) film 11 of 100 nm thick is formed on the surface of the Ti film 10. The TiN film 11 is formed, for example, by reactive DC sputtering with a DC input power of 5 kW and a substrate temperature of 200° C. by using Ti as a target and nitrogen (N) gas at a pressure of 4 mtorr as sputtering gas.

Next, on the surface of the TiN film 11, an AlSiCu alloy film 12 is formed to a thickness of 500 nm. The AlSiCu alloy film 12 is formed, for example, by DC sputtering with a DC input power of 9 kW and a substrate temperature of 200° C. by using AlSiCu alloy as a target and Ar gas at a pressure of 3 mtorr as sputtering gas. The contents of Si and Cu are 1 wt. and 0.5 wt. %, respectively.

Each sputter film does not deposit easily on the inner surface of the contact hole 7. Therefore, the thickness of the films deposited on the inner surface of the contact hole is thinner than that of the films formed on the upper surface of the BPSG film 3.

Figure 2B:
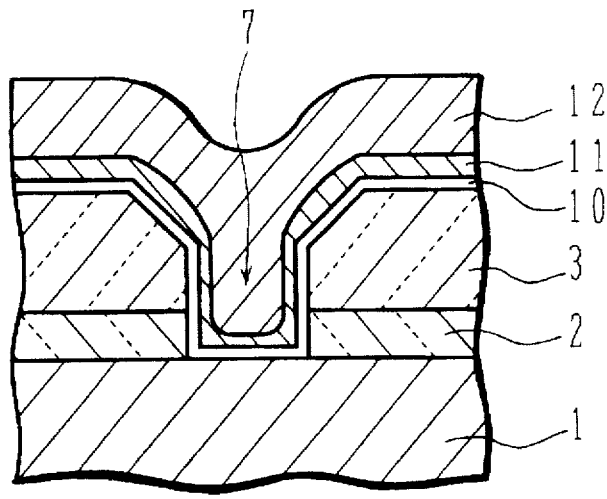

As shown in FIG. 2B, a reflow process is performed to mobilize AlSiCu alloy so as to bury the inside of the contact hole 7 with AlSiCu alloy. The reflow process is performed, for example, in a vacuum atmosphere of about $2\times10^{-8}$ torr for 180 seconds at 430° C.

Forming Ti/TiN/AlSiCu films and the reflow process will be described with reference to FIG. 3.

Figure 3:
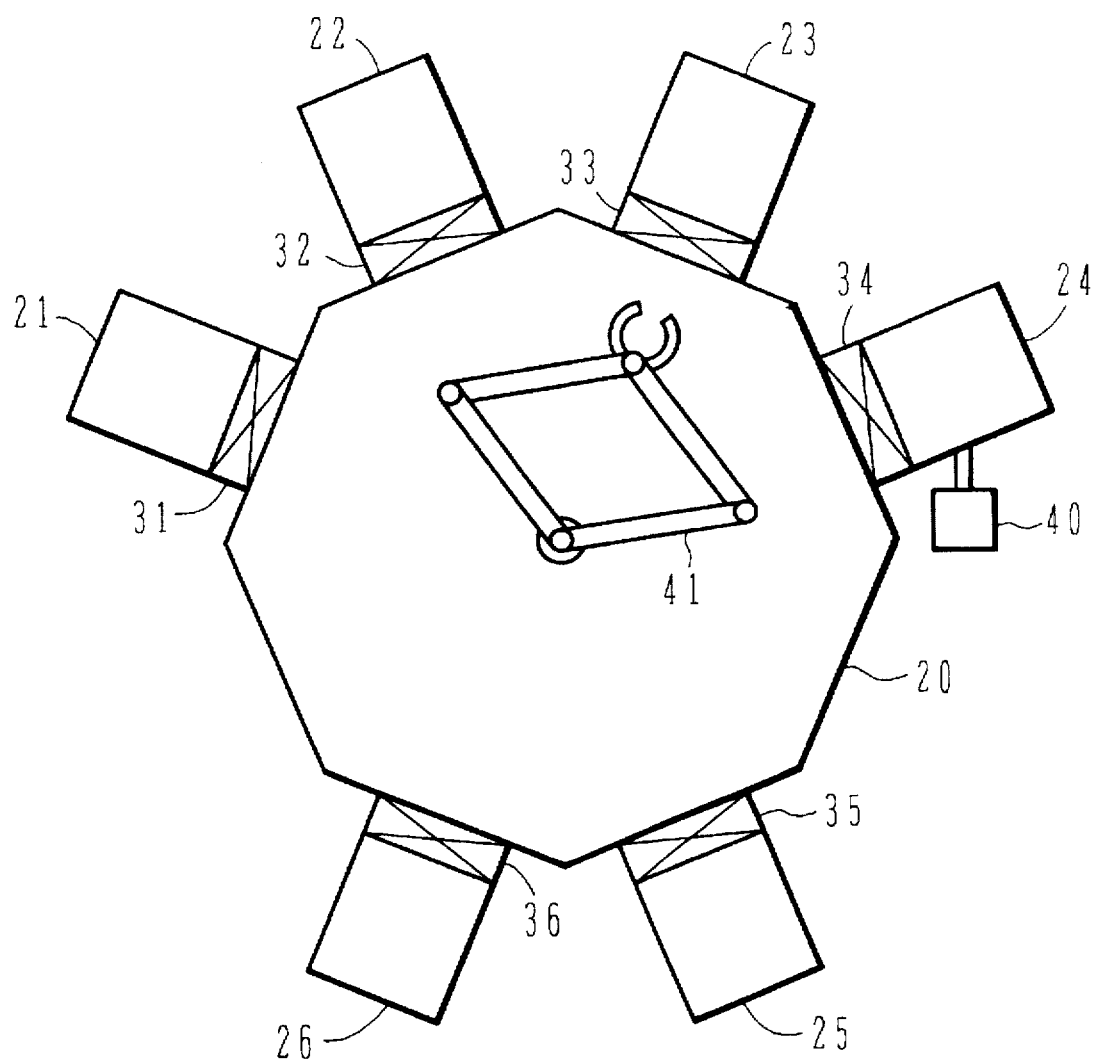
FIG. 3 is a schematic plan view of a sputtering system used by the embodiment method.

FIG. 3 is a schematic plan view of a sputtering system. Sputtering chambers 21, 22 and 23, a reflow chamber 24, and load-lock chambers 25 and 26 are coupled radially to the periphery of a transport chamber 20. Between the transport chamber 20 and each chamber 21–26, gate valves 31 to 36 are provided, respectively. The inside of each chamber 20–26 can be evacuated independently.

A robot arm 41 is mounted in the transport chamber 20. The robot arm 41 can transport a wafer to and from each chamber 21–26.

A mass spectrometer 40 is installed at the reflow chamber 24, allowing a gas partial pressure in the reflow chamber 24 to be measured.

After removing the resist film 4 shown in FIG. 1D, the substrate with having the contact hole 7 formed in the BPSG film 3 and PSG film 2 is loaded in the load-lock chamber 25. The robot arm 41 then transports the substrate from the load-lock chamber 25 to the sputtering chamber 21. In the sputtering chamber 21, the Ti film 10 is formed through sputtering using a Ti target.

The robot arm 41 then transports the substrate from the sputtering chamber 21 to the sputtering chamber 22. In the sputtering chamber 22, the TiN film 11 is formed through reactive sputtering using a Ti target. The robot arm 41 then transports the substrate from the sputtering chamber 22 to the sputtering chamber 23. In the sputtering chamber 23, the AlSiCu alloy film 12 is formed through sputtering using an AlSiCu target.

A Ti sputter film is formed on the inner wall of the reflow chamber 24 by sputtering using a Ti target. For example, this sputtering is performed under the same conditions that, if a sample substrate is placed in the reflow chamber 24, a Ti film of 100 nm thick is formed on the surface thereof. The sample substrate may not be placed in the reflow chamber 24, or the sample substrate may be placed.

The robot arm 41 transports the substrate in the sputtering chamber 23 to the reflow chamber 24. The inside of the reflow chamber 24 is evacuated to a vacuum degree of $1\times10^{-8}$ torr or lower. The reflow process is performed for 180 seconds at a substrate temperature of 430° C. The temperature during the reflow process may be set to 400° to 450° C. After the reflow process, the robot arm 41 transports the substrate from the reflow chamber 24 to the load-lock chamber 26.

Figure 4A:
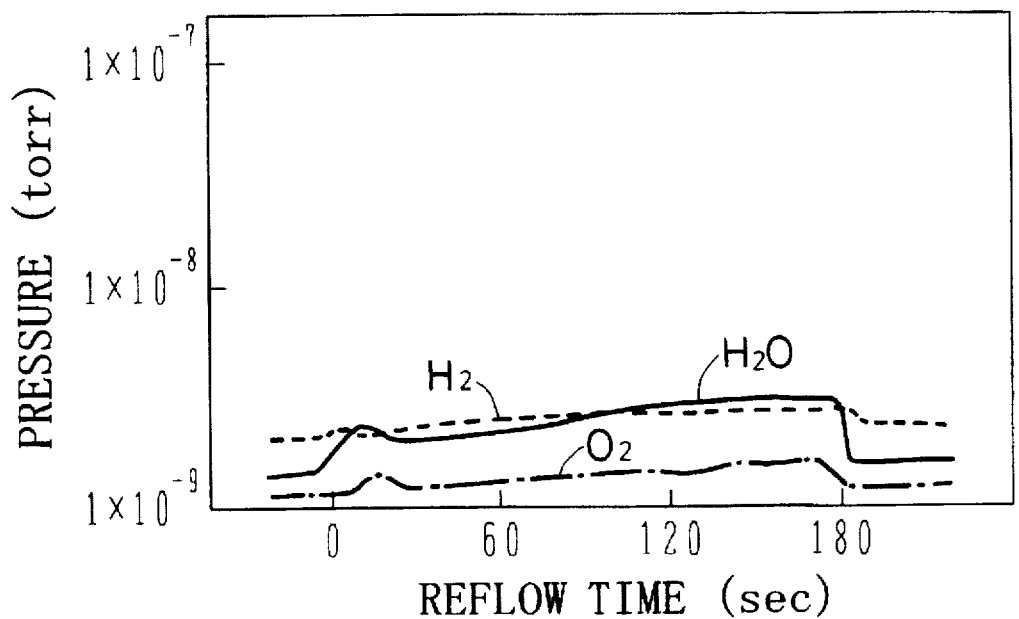
FIGS. 4A and 4B are graphs showing a gas partial pressure change with time during the reflow process.
Figure 4B:
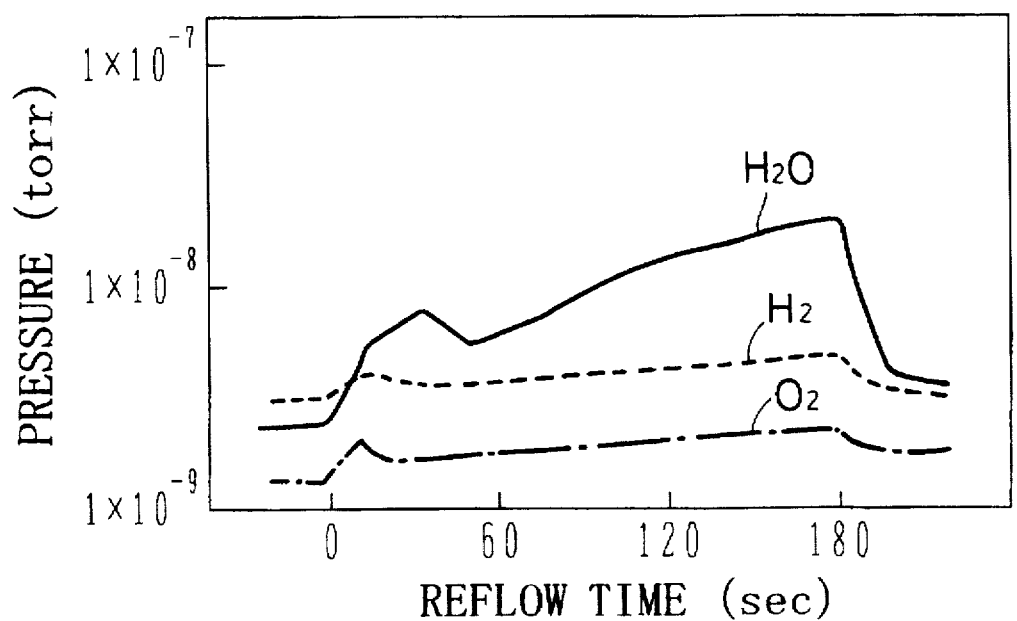

FIG. 4A Is a graph showing a gas partial pressure change with time in the reflow chamber with a Ti sputter film formed thereon, the partial pressure being analyzed with the mass spectrometer 40. For the comparison, a gas partial pressure change with time, when the Ti sputter film was not formed on the inner wall of the reflow chamber before the start of the reflow process, is shown in FIG. 4B. The abscissa represents a reflow time during the reflow process in the unit of second, and the ordinate represents a gas partial pressure in the unit of torr. A solid line in FIGS. 4A and 4B indicates a partial pressure of water vapor ($H_2O$), a broken line indicates a partial pressure of hydrogen ($H_2$), and a one-dot-chain line indicates a partial pressure of oxygen ($O_2$).

As shown in FIG. 4A, the partial pressure of each gas temporarily rises immediately after the start of the reflow process. This may be ascribed to gas released from the inside of the heated reflow chamber. After the partial pressure temporarily rises, it gradually rises as the reflow time lapses. The partial pressure of $H_2O$ gas particularly rises higher than those of $O_2$ and $H_2$. This may be ascribed to water vapor released from the BPSG film. Although the gas partial pressure rises as the reflow time lapses, the pressure in the reflow chamber is $1\times10^{-8}$ torr or lower even after a time lapse of 180 seconds after the start of the reflow process.

As shown in FIG. 4B, if the Ti sputter film is not formed before the start of the reflow process, the gas partial pressure and its rise rate are larger than if the Ti sputter film is formed. A rise of the partial pressure of $H_2O$ gas is particularly large. After the lapse of 180 seconds after the start of the reflow process, the pressure in the reflow chamber rises to about $3 \times 10^{-8}$ torr. The degree of vacuum before the start of the reflow process is also lower than that shown in FIG. 4A.

As seen from FIGS. 4A and 4B, by forming a Ti sputter film on the inner wall of the reflow chamber before the start of the reflow process, it becomes possible to raise the vacuum degree before the start of the reflow process and to suppress a pressure rise during the reflow process. The reason for this may be the gettering effects of Ti. The surface of the AlSiCu alloy layer can be prevented from being oxidized by $H_2O$ and $O_2$.

Figure 2C:
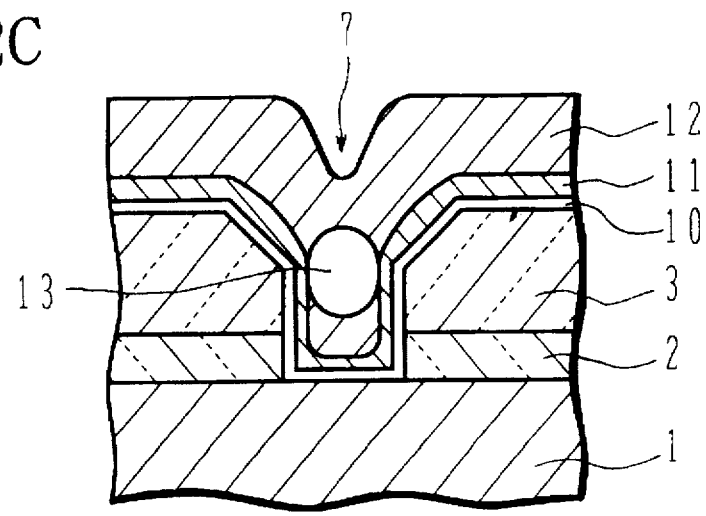
FIG. 2C is a cross sectional view showing a void formed in a wiring layer.

FIG. 2C is a cross sectional diagram showing a wiring layer formed with a void 13 in the contact hole 7. When the reflow process was performed without forming the Ti sputter film on the inner wall of the reflow chamber, a void 13 such as shown in FIG. 2C was often formed. In contrast, when the Ti sputter film was formed on the inner wall of the reflow chamber before the start of the reflow process, a void 13 was not formed as illustrated in FIG. 2B. As above, by forming a Ti sputter film on the inner wall of the reflow chamber before the start of the reflow process, formation of a void in the contact hole can be suppressed.

From the plurality of experiments of reflow processes, it has been found that the gettering effects can be obtained sufficiently, if a Ti sputter film is formed, each time after 100 substrates are subjected to the reflow processes, under the conditions, if a dummy sample substrate is placed on the susceptor In the reflow chamber 24, a Ti film of 1 μm thick is formed on the surface of the sample substrate. When the process of forming Ti/TiN/AlSiCu films and the reflow process described with FIG. 3 are repetitively performed for a number of substrates, it is sufficient that the Ti film is formed once for a plurality of substrates (e.g., 100 substrates). Therefore, the Ti sputter film formed once on the inner wall of the reflow chamber maintains its effects for a plurality of reflow processes.

In FIG. 3, although the sputtering chamber 21 for Ti sputtering and the reflow chamber 24 are provided separately, the sputtering chamber 21 may be used as the reflow chamber because they have the same structure.

In the above embodiment, AlSiCu alloy is used as the wiring layer. Other reflowable materials such as Al alloy may be used.

Also in the above embodiment, although the Ti sputter film is formed on the inner wall of the reflow chamber by sputtering, other methods may be used. For example, Ti filament may be used as a Ti sputtering source.

Next, an example of a CMOS circuit formed by the embodiment method of forming an wiring layer will be described with reference to FIGS. 5, 6A, and 6B.

Figure 5:
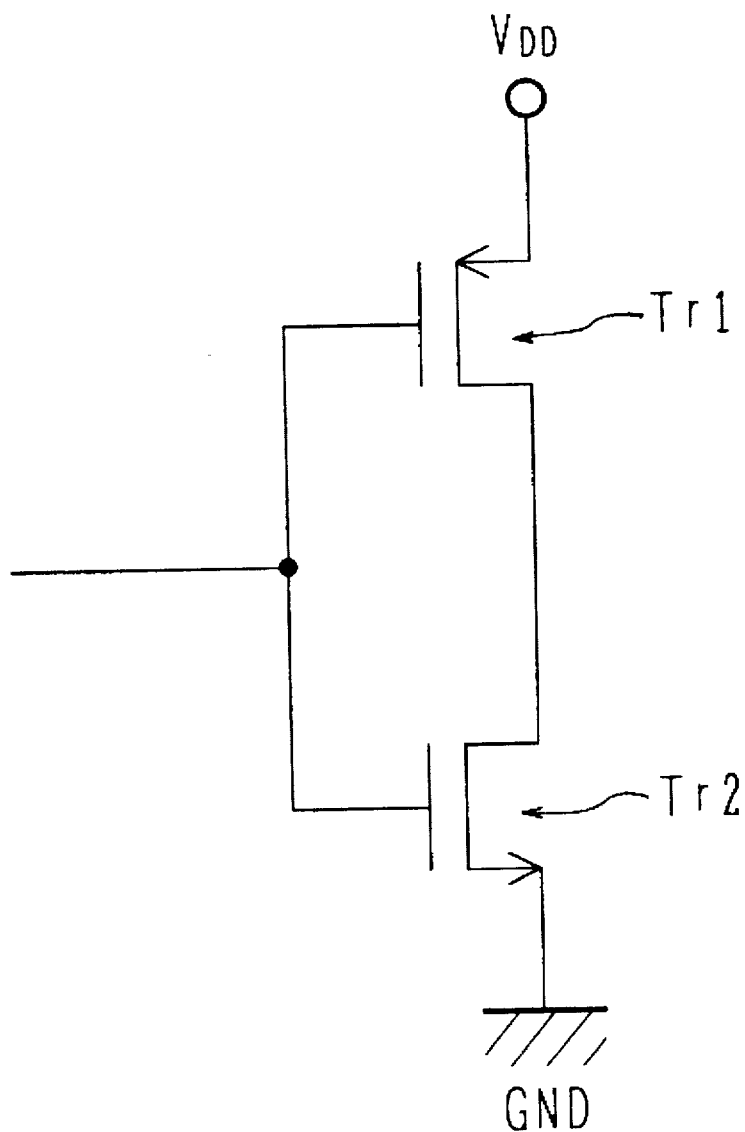
FIG. 5 is an equivalent circuit of a CMOS circuit device.

FIG. 5 is an equivalent circuit of a CMOS circuit. A CMOS circuit having p- and n-channel MOS transistors Tr1 and Tr2 with their drain terminals connected in common is connected between a power source line $V_{DD}$ and a ground line GND. The gate terminals of the transistors Tr1 and Tr2 are connected in common.

Figure 6A:
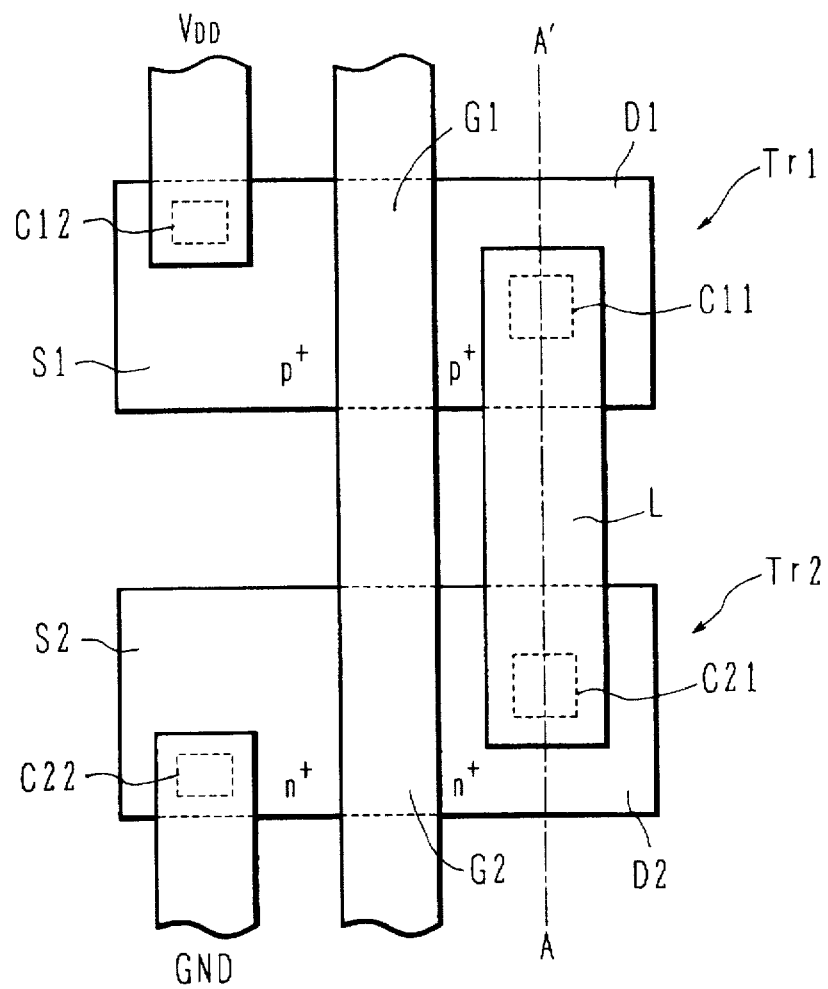
FIGS. 6A and 6B are a plan view and a cross sectional view of the CMOS circuit device.

FIG. 6A is a plan view showing a substrate layout of the CMOS circuit shown in FIG.5. In two active regions disposed at upper and lower positions in FIG. 6A, the p-channel and n-channel MOS transistors are formed. The p-channel MOS transistor Tr1 has a $p^+$-type source region S1, a gate electrode G1, and a $p^+$-type drain region D1. The n-channel MOS transistor Tr2 has an $n^+$-type source region S2, a gate electrode G2, and an $n^+$-type drain region D2.

The source region S1 is connected to an upper layer power source line $V_{DD}$ via a contact hole C12, and the other source region S2 is connected to an upper ground line GND via a contact hole C22. The gate electrodes G1 and 62 are connected together by the same wiring extending in the vertical direction in FIG. 6A. The drain regions D1 and D2 are connected via contact holes C11 and C21 to a common upper wiring L.

Figure 6B:
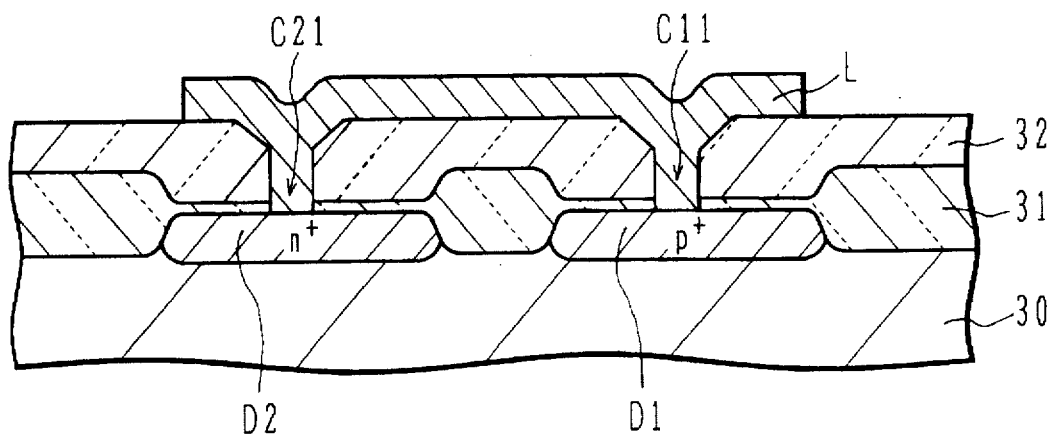

FIG. 6B is a cross sectional view taken along one-dot-chain line A-A' shown in FIG.11A. The two active regions are defined by a field oxide film 51 formed on the surface of a silicon substrate 50. The $n^+$-type drain region D2 is formed in the surface layer of one active region, and the $p^+$-type drain region D1 is formed in the surface layer of the other active region. The drain regions D1 and D2 are connected with each other by the upper wiring L.

The surfaces of the drain regions D1 and D2 correspond to the surface of the silicon substrate 1 shown in FIG. 2B. The laminating structure consisting of gate oxide films formed on the surface of the drain regions D1, D2 and the interlayer insulating film 52 correspond to the laminating structure consisting of the PSG film 2 and BPSG film 3 shown in FIG. 2B. The contact holes C11 and C21 correspond to the contact hole 7 shown in FIG.2B. The upper wiring L is formed by the method similar to that described with FIGS.2A and 2B.

Since the upper wiring L has no void at the contact holes C11 and C21, good electrical connections are ensured between the drain regions D1 and D2 and the upper wiring L.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device comprising the steps of:

forming an insulating layer on a substrate having a semiconductor surface;

forming a contact hole in and through the insulating layer;

forming a conductive film on the inner surface of the contact hole and on the surface of the insulating film;

forming a vapor deposited titanium film on the inner wall of a first vacuum chamber;

placing the substrate formed with the conductive film in the first vacuum chamber; and heating the substrate and reflowing the conductive film.

2. A method according to claim 1, wherein said conductive film forming step places the substrate in another vacuum chamber connected to the first vacuum chamber via a transport vacuum chamber and forms the conductive film, and said step of placing the substrate in the first vacuum chamber includes the steps of transporting the substrate from said another vacuum chamber to the transport vacuum chamber and transporting the substrate from the transport vacuum chamber to the first vacuum chamber.

3. A method according to claim 2, wherein said conductive film forming step forms the conductive film by sputtering, and said vapor deposited titanium film forming step forms the vapor deposited titanium film by sputtering.

4. A method according to claim 1, wherein said conductive film forming step forms the conductive film by sputtering, and said vapor deposited titanium film forming step forms the vapor deposited titanium film by sputtering.

5. A method according to claim 4, further comprising the step of processing a plurality of substrates by repeating a plurality of times said insulating film forming step, said contact hole forming step, said conductive film forming step, said step of placing the substrate in the vacuum chamber, and said heating and reflowing step, sequentially in this order.

6. A method according to claim 1, further comprising the step of processing a plurality of substrates by repeating a plurality of times said insulating film forming step, said contact hole forming step, said conductive film forming step, said step of placing the substrate in the vacuum chamber, and said heating and reflowing step, sequentially in this order.

7. A method according to claim 1, wherein the conductive film includes an alloy film containing Al as a main component.

8. A method according to claim 7, wherein said heating and reflowing step heats the conductive film to the range from 400° to 450° C.

* * * * *